United States Patent
Kim

(10) Patent No.: US 10,168,378 B2
(45) Date of Patent: Jan. 1, 2019

(54) ELECTRONIC DEVICE AND METHOD OF DETERMINING ABNORMALITY OF ELECTRONIC DEVICE CONNECTING UNIT

(71) Applicant: Samsung Electronics Co., Ltd., Gyeonggi-do (KR)

(72) Inventor: Yeon-Beom Kim, Seoul (KR)

(73) Assignee: Samsung Electronics Co., Ltd (KR)

( * ) Notice: Subject to any disclaimer, the term of this patent is extended or adjusted under 35 U.S.C. 154(b) by 430 days.

(21) Appl. No.: 14/971,098

(22) Filed: Dec. 16, 2015

(65) Prior Publication Data

US 2016/0169956 A1    Jun. 16, 2016

(30) Foreign Application Priority Data

Dec. 16, 2014 (KR) .......................... 10-2014-0181536

(51) Int. Cl.
| | | |
|---|---|---|
| *H01H 47/00* | (2006.01) | |
| *H01H 83/00* | (2006.01) | |
| *H02J 7/00* | (2006.01) | |
| *G01R 31/04* | (2006.01) | |
| *G06F 11/00* | (2006.01) | |

(52) U.S. Cl.
CPC ............ *G01R 31/043* (2013.01); *G06F 11/00* (2013.01)

(58) Field of Classification Search
USPC .............................................. 307/125; 361/1
See application file for complete search history.

(56) References Cited

U.S. PATENT DOCUMENTS

| | | | | |
|---|---|---|---|---|
| 5,043,657 A | * | 8/1991 | Amazeen | H01L 23/544 257/E23.179 |
| 5,696,451 A | * | 12/1997 | Keirn | G01R 31/04 324/537 |
| 6,560,485 B2 | * | 5/2003 | Herleikson | A61N 1/39 607/27 |
| 6,772,380 B1 | * | 8/2004 | Ali | G01R 31/045 324/539 |
| 7,237,049 B2 | * | 6/2007 | Kang | G06K 19/07309 710/104 |

(Continued)

FOREIGN PATENT DOCUMENTS

| | | |
|---|---|---|
| KR | 1997-0070992 | 11/1997 |
| KR | 10-2004-0082133 | 9/2004 |
| KR | 10-0458383 | 11/2004 |

*Primary Examiner* — Adam Houston
(74) *Attorney, Agent, or Firm* — The Farrell Law Firm, P.C.

(57) ABSTRACT

An electronic device and method of determining an abnormality or a normality of a connecting unit in an electronic device is provided. The electronic device includes an external device connecting unit having a first function connecting unit and a second function connecting unit, wherein the first function connecting unit includes a first identification (first ID) pin configured to detect a connection with an external electronic device, and wherein the second function connecting unit includes a second identification (second ID) pin configured to detect the connection with the external electronic device, and a processor configured to determine that an abnormality occurs in the external device connecting unit when values measured from the first ID pin and the second ID pin satisfy a predetermined condition.

18 Claims, 8 Drawing Sheets

(56) References Cited

U.S. PATENT DOCUMENTS

| | | | | |
|---|---|---|---|---|
| 7,343,147 B2* | 3/2008 | Ruff | H04M 1/24 | 320/137 |
| 7,783,902 B2* | 8/2010 | Nakamura | G05B 19/058 | 713/300 |
| 7,881,323 B2* | 2/2011 | Wong | H03K 19/177 | 370/419 |
| 8,179,171 B1* | 5/2012 | Zhang | G11C 5/148 | 327/143 |
| 8,519,819 B2* | 8/2013 | Scherr | H04L 5/1484 | 340/10.3 |
| 8,595,490 B2* | 11/2013 | von Mueller | G06Q 20/085 | 713/168 |
| 8,683,087 B2* | 3/2014 | Connolly | G06F 13/387 | 710/11 |
| 8,698,760 B2* | 4/2014 | Prendergast | G06F 3/0416 | 345/173 |
| 8,743,384 B2* | 6/2014 | Ishii | G03G 21/1652 | 358/1.12 |
| 9,071,769 B2* | 6/2015 | Chen | H04N 3/27 | |
| 9,123,442 B2* | 9/2015 | Li | G11C 29/022 | |
| 9,195,297 B2* | 11/2015 | Chen | G06F 1/325 | |
| 9,268,728 B2* | 2/2016 | Lai | G06F 13/385 | |
| 9,418,032 B2* | 8/2016 | Terlizzi | G06F 13/385 | |
| 9,541,434 B2* | 1/2017 | Knittel | G01D 21/02 | |
| 9,648,476 B2* | 5/2017 | Frohlick | H04W 4/90 | |
| 9,818,108 B2* | 11/2017 | von Mueller | G06Q 20/085 | |
| 9,819,397 B2* | 11/2017 | McCormack | G06F 13/00 | |
| 2004/0263351 A1* | 12/2004 | Joy | G01D 21/02 | 340/870.01 |
| 2010/0188002 A1* | 7/2010 | Hung | H05B 33/0815 | 315/122 |
| 2011/0184586 A1* | 7/2011 | Asano | G05B 15/02 | 700/297 |
| 2012/0159228 A1* | 6/2012 | Arimoto | G03G 15/5004 | 713/340 |
| 2012/0292070 A1* | 11/2012 | Ito | H02K 5/225 | 173/217 |
| 2013/0070016 A1* | 3/2013 | Maeda | B41J 29/393 | 347/19 |
| 2014/0014384 A1* | 1/2014 | Horie | H01M 2/105 | 173/217 |
| 2014/0098395 A1* | 4/2014 | Chosokabe | H04N 1/00899 | 358/1.14 |
| 2014/0337556 A1* | 11/2014 | Gu | G06F 1/1632 | 710/303 |
| 2015/0214943 A1* | 7/2015 | Tirunagari | H03K 17/16 | 327/382 |
| 2016/0061970 A1* | 3/2016 | Asai | G01T 1/175 | 702/182 |
| 2016/0065000 A1* | 3/2016 | Maeda | H02J 9/061 | 307/23 |
| 2016/0081625 A1* | 3/2016 | Kim | H04R 25/556 | 600/301 |
| 2016/0169956 A1* | 6/2016 | Kim | G01R 31/043 | 307/125 |
| 2016/0202315 A1* | 7/2016 | Hu | G01R 31/31705 | 714/727 |
| 2017/0134852 A1* | 5/2017 | Lee | H04R 25/556 | |
| 2017/0155720 A1* | 6/2017 | Song | G06F 8/38 | |
| 2017/0161226 A1* | 6/2017 | Gerber | G06F 13/4282 | |
| 2017/0177069 A1* | 6/2017 | Bedare | G06F 1/3296 | |
| 2017/0264450 A1* | 9/2017 | Horiuchi | H04L 12/1827 | |
| 2017/0278320 A1* | 9/2017 | Isozaki | G07C 5/008 | |
| 2017/0280261 A1* | 9/2017 | Kobayashi | G06F 13/00 | |
| 2017/0294095 A1* | 10/2017 | Asano | G08B 21/0423 | |
| 2017/0318923 A1* | 11/2017 | Gharabegian | A45B 25/00 | |
| 2018/0069598 A1* | 3/2018 | McCormack | G06F 13/00 | |
| 2018/0082501 A1* | 3/2018 | Kochhar | G06F 1/163 | |

\* cited by examiner

ELECTRONIC DEVICE AND METHOD OF DETERMINING ABNORMALITY OF ELECTRONIC DEVICE CONNECTING UNIT

PRIORITY

This application claims priority under 35 U.S.C. § 119(a) to Korean Application filed on Dec. 16, 2014 in the Korean Intellectual Property Office and assigned Serial No. 10-2014-0181536, the entire contents of which are incorporated herein by reference.

BACKGROUND

1. Field of the Invention

The present invention relate generally to an electronic device and a method of determining an abnormality of an electronic device connecting unit, and more particularly, to an electronic device and a method of determining an abnormality of an electronic device connecting unit to prevent damage and malfunction by detecting a voltage of an identification pin to determining flooding or foreign particle invasion of the connecting unit.

2. Description of the Related Art

In general, an electronic device refers to a device performing a function according to an installed program, such as home appliances, a digital organizer, a portable multimedia player, a mobile communication terminal, a tablet Personal Computer (PC), image and sound devices, a desktop computer, a laptop computer, and a navigation device for vehicles. For example, such electronic devices may output stored information as a sound or an image. Recently, various functions have been incorporated into a single mobile communication terminal as the degree of integration of such an electronic device has increased and high capacity and high speed wireless communication has become common.

For example, an entertainment function, such as a game, a multimedia function, such as reproduction of a music file and a video file, a communication and security function for mobile banking or the like, a scheduling function, an electronic wallet function, etc. are integrated into a single electronic device, in addition to a communication function.

In addition, an electronic device includes various types of connecting units which can be connected with external electronic devices.

When a current flows in a connecting unit in a state in which the connecting unit of an electronic device connected to an external electronic device is exposed to moisture (e.g. flooded with water), humidity invades the connecting unit, or foreign particles invade the connecting unit. Thus, migration deposition, corrosion, and the like may occur in the connecting unit, and the electronic device may operate abnormally or an internal circuit of the electronic device may be damaged.

In addition, when a separate cover is equipped on the connecting unit so as to prevent the invasion of humidity via the connecting unit, the appearance of the product is diminished and a user may be inconvenienced with having to open the cover to use the connecting unit.

In addition, for example, if an electronic device including a micro Universal Serial Bus (USB) connecting unit is operated as a function of an On The Go (OTG) or a USB host, when power (e.g., power of 5 V) is provided to a connecting pin (e.g., a V_bus pin) for providing the power to an external device, when humidity occurs in the connecting unit, corrosion of the connecting unit may accelerate. In addition, when the OTG function is removed from the USB connecting unit or a user configures an automatic connection for the OTG function as an off state, the user is inconvenienced in having to use the OTG function.

SUMMARY

The present invention has been made to address the above-mentioned problems and disadvantages, and to provide at least the advantages described below. Accordingly, an aspect of the present invention provides an electronic device and a method of determining an abnormality or a normality of an electronic device connecting unit capable of determining a flooding-or-not or a particle-invasion-or-not by analyzing a measured value of an IDentification (ID) pin in each of a plurality of connecting units in an external device connecting unit including the plurality of connecting units having at least two different functions in one physical connecting unit.

According to an aspect of the present invention, an electronic device is provided. The electronic device includes an external device connecting unit comprising a first function connecting unit and a second function connecting unit, wherein the first function connecting unit includes a first identification (first ID) pin configured to detect a connection with an external electronic device, and wherein the second function connecting unit includes a second identification (second ID) pin configured to detect the connection with the external electronic device, and a processor configured to determine that an abnormality or a normality occurs in the external device connecting unit when values measured from the first ID pin and the second ID pin satisfy a predetermined condition.

According to another aspect of the present invention, a method of determining an abnormality or a normality of a connecting unit in an electronic device is provided. The method includes checking a value measured from a first identification (first ID) pin which is included in a first function connecting unit of an external device connecting unit, which is for detecting a connection with an external electronic device, checking a value measured from a second identification (second ID) pin which is included in a second function connecting unit of the external device connecting unit, which is for detecting the connection with the external electronic device, and determining the abnormality occurs in the external device connecting unit when the values measured from the first ID pin and the second ID pin satisfy a predetermined condition.

BRIEF DESCRIPTION OF THE DRAWINGS

The above and other aspects, features, and advantages of the present invention will be more apparent from the following detailed description, taken in conjunction with the accompanying drawings, in which.

DETAILED DESCRIPTION OF EMBODIMENTS OF THE PRESENT INVENTION

Figure 1:
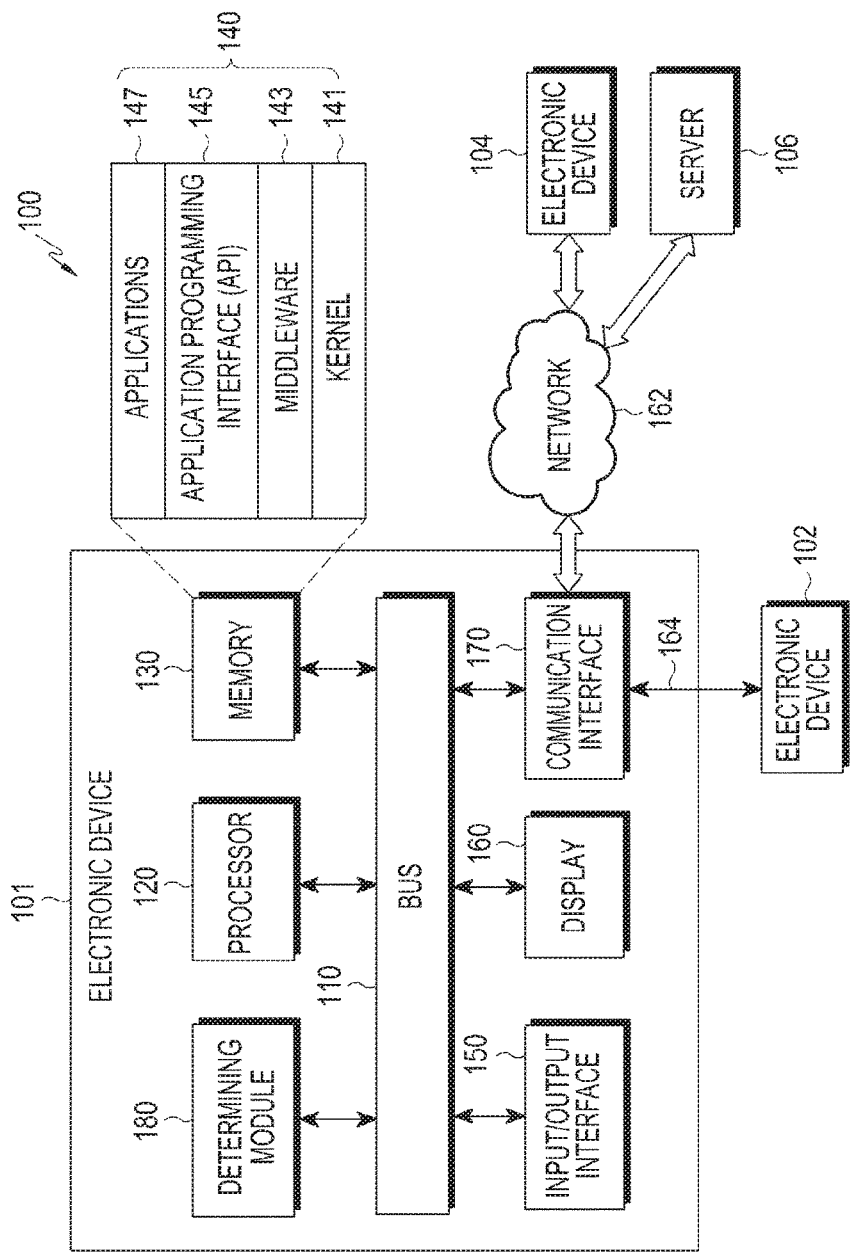
FIG. 1 is a block diagram of a network environment according to an embodiment of the present invention.

Hereinafter, various embodiments of the present invention are disclosed with reference to the accompanying drawings. However, it should be understood that there is no intent to limit the present invention to the particular forms disclosed herein; rather, the present invention should be construed to cover various modifications, equivalents, and/or alternatives of embodiments of the present invention. In the description of the drawings, similar reference numerals may be used to designate similar elements.

In the present disclosure, the expressions "have," "may have," "include," or "may include" refer to the existence of a corresponding feature (e.g., numerical value, function, operation, or components such as elements), and do not exclude the existence of additional features.

In the present disclosure, the expressions "A or B," "at least one of A or/and B," or "one or more of A or/and B" may include all possible combinations of the items listed. For example, the expression "A or B," "at least one of A and B," or "at least one of A or B" refers to all of (1) including at least one A, (2) including at least one B, or (3) including all of at least one A and at least one B.

The expressions "a first," "a second," "the first," or "the second" used in various embodiments of the present invention may modify various components regardless of the order and/or the importance but does not limit the corresponding components. The expressions may be used to distinguish a component element from another component element. For example, a first user device and a second user device may indicate different user devices regardless of the sequence or importance thereof. For example, a first element may be referred to as a second element, and similarly, a second element may be referred to as a first element without departing from the scope of the present invention.

When it is mentioned that one element (e.g., a first element) is "operatively or communicatively coupled with/to or connected to" another element (e.g., a second element), it should be construed that the one element is directly connected to the other element or the one element is indirectly connected to the other element via yet another element (e.g., a third element). Conversely, when one component element is "directly coupled" or "directly connected" to another component element, it may be construed that a third component element does not exist between the first component element and the second component element.

The expression "configured to" used in the present disclosure may be exchanged with, for example, "suitable for," "having the capacity to," "designed to," "adapted to," "made to," or "capable of" according to the situation. The term "configured to" may not necessarily imply "specifically designed to" in hardware. Alternatively, in some situations, the expression "device configured to" may indicate that the device, together with other devices or components, "is able to." For example, the phrase "processor adapted (or configured) to perform A, B, and C" may refer to a dedicated processor (e.g. an embedded processor) only for performing the corresponding operations or a general-purpose processor (e.g., a Central Processing Unit (CPU) or an Application Processor (AP)) that can perform the corresponding operations by executing one or more software programs stored in a memory device.

As used herein, the expression "connection unit" may refer to a unit for electrically connecting a first electronic device and a second electronic device to each other, and is not limited by a specific connection method or connection type. Further, when a second electronic device is connected to a connection unit provided in a first electronic device, data or power may be transmitted and received between the first and second electronic devices. The data or power may be unidirectionally (e.g., from the first electronic device to the second electronic device or from the second electronic device to the first electronic device) or bidirectionally transmitted and received. Further, the "connection unit" may refer to one physical connection unit, and may also refer to each of a plurality of connection units that perform different functions in one physical connection unit.

The terms used in the present disclosure are only used to describe embodiments of the present invention, and are not intended to limit the present invention. As used herein, singular forms may include plural forms as well, unless the context clearly indicates otherwise. Unless defined otherwise, all terms used herein, including technical and scientific terms, have the same meaning as those commonly understood by a person skilled in the art to which the present invention pertains. Such terms as those defined in a generally used dictionary are to be interpreted to have the meanings equal to the contextual meanings in the relevant field of the art, and are not to be interpreted to have ideal or excessively formal meanings unless clearly defined in the present invention. In some cases, even a term defined in the present invention should not be interpreted to exclude embodiments of the present invention.

For example, the electronic device may include at least one of a smartphone, a tablet Personal Computer (PC), a mobile phone, a video phone, an electronic book (e-book) reader, a desktop PC, a laptop PC, a netbook computer, a Personal Digital Assistant (PDA), a Portable Multimedia Player (PMP), a Moving Picture Experts Group Audio Layer 3 (MP3) player, a mobile medical appliance, a camera, and a wearable device (e.g., a Head-Mounted-Device (HMD) such as electronic glasses, electronic clothes, an electronic bracelet, an electronic necklace, an electronic appcessory, electronic tattoos, or a smart watch).

According to some embodiments of the present invention, the electronic device may be a smart home appliance. The home appliance may include at least one of, for example, a television, a Digital Video Disk (DVD) player, an audio player, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment of the present invention, the electronic device may include at least one of various medical devices (e.g., various portable medical measuring devices (a blood glucose monitoring device, a heart rate monitoring device, a blood pressure measuring device, a body temperature measuring device, etc.), Magnetic Resonance Angiography (MRA), Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), Vehicle Infotainment Devices, electronic devices for a ship (e.g., a navigation device for a ship, and a gyro-compass), avionics, security devices, an automotive head unit, a robot for home or industry, an Automatic Teller Machine (ATM) in banks, Point of Sales (POS) in a shop, or Internet of Things device (e.g., a light bulb, various sensors, electric or gas meter, a sprinkler device, a fire alarm, a thermostat, a streetlamp, a toaster, a sporting goods device, a hot water tank, a heater, a boiler, etc.).

According to some embodiments of the present invention, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device according to various embodiments of the present invention may be a combination of one or more of the aforementioned various devices. The electronic device according to some embodiments of the present invention may be a flexible device. Further, the electronic device according to an embodiment of the present invention is not limited to the aforementioned devices, and may include a new electronic device according to the development of technology Hereinafter, an electronic device according to various embodiments of the present invention will be described with reference to the accompanying drawings. In the present invention, the term "user" may indicate a person using an electronic device or a device (e.g. an artificial intelligence electronic device) using an electronic device.

FIG. 1 is a block diagram of a network environment 100 according to an embodiment of the present invention.

Referring to FIG. 1, an electronic device 101 in the network environment 100 is disclosed. The electronic device 101 includes at least one of a bus 110, a processor 120, a memory 130, an input/output interface 150, a display 160, a communication interface 170 and a determining module 180. In an embodiment of the present invention, the electronic device 101 may omit at least one of the elements or add another element.

For example, the bus 110 connects the above-mentioned elements 110 to 180 and includes a circuit for transmitting communication (e.g., a control message and/or data) among the elements 110 to 180.

The processor 120 includes at least one of a Central Processing Unit (CPU), an Application Processor (AP) and a Communication Processor (CP). For example, the processor 120 executes a control of at least one of the other elements, a calculation related to a communication, or a processing of data.

The memory 130 includes a volatile memory and/or a nonvolatile memory. For example, the memory 130 stores a command or data related to at least one of the other elements in the electronic device 101. According to an embodiment of the present invention, the memory 130 stores software and/or a program 140. For example, the program 140 includes a kernel 141, middleware 143, an Application Programming Interface (API) 145, an application program (or application) 147, and the like. At least one of the kernel 141, the middleware 143 and the API 145 may be referred to as an Operating System (OS).

For example, the kernel 141 controls or manages system resources (e.g., the bus 110, the processor 120, the memory 130, etc.) used for executing an operation or a function implemented in other programs (e.g., the middleware 143, the API 145, or the application program 147). Further, the kernel 141 provides an interface that enables the middleware 143, the API 145, or the application program 147 to access an individual component of the electronic device 101 to control or manage the system resources.

The middleware 143 functions as a relay so that the API 145 or the application program 147 communicates with the kernel 141 to transmit and receive data to and from the kernel 141. Further, in relation to requests for an operation received from the application program 147, the middleware 143 controls (e.g., schedules or load-balances) the requests by using, for example, a method of determining a sequence of using the system resources (e.g., the bus 110, the processor 120, the memory 130, or the like) of the electronic device 101 with respect to at least one application among the application programs 147.

For example, the API 145 is an interface used by the application 147 to control a function provided by the kernel 141 or the middleware 143, and includes, for example, at least one interface or function (e.g. a command) for file control, window control, image processing, character control, etc.

For example, the input/output interface 150 functions as an interface for transferring a command or data input from a user or an external device to the other element(s) of the electronic device 101. In addition, the input/output interface 150 outputs the command or data received from the other element(s) of the electronic device 101 to the user or an external device.

According to an embodiment of the present invention, the input/output interface 150 includes at least one connecting unit. The electronic device 100 may be connected to an external electronic device 102 to transmit or receive data or power to or from the external electronic device 102.

According to an embodiment of the present invention, the determining module 180 determines an abnormality or a normality of the connecting unit by comparing a measured value (e.g., a voltage or a resistance) which is measured from an IDentification (ID) pin included in the connecting unit of the input/output interface 150 or the communication interface 170 to a predetermined value. The connecting unit include at least one pin according to various supportable protocols (e.g., a Universal Serial Bus (USB) or a micro USB or (e.g. µUSB), but is not limited thereto). The ID pin among at least one pin is a pin for detecting whether at least one external electronic device which may be connected to the electronic device 101 via the connecting unit is connected to the electronic device 101 or not and for detecting a type of the connected electronic device.

Detailed embodiments related to this are described in or below descriptions of FIG. 2. Although the determining module 180 is connected to the input/output interface 150 or the communication interface 170 via the bus 110 in FIG. 1, the present invention is not limited thereto, and the determining module 180 may be directly connected to the input/output interface 150 or the communication interface 170.

For example, the display 160 may include a Liquid Crystal Display (LCD), a Light Emitting Diode (LED) display, an Organic Light Emitting Diode (OLED) display, a MicroElectroMechanical Systems (MEMS) display, or an electronic paper display. For example, the display 160 displays various types of contents (e.g., text, an image, a video, an icon, a symbol, or the like) to a user. The display 160 may include a touch screen and receive an input of a touch using an electronic pen or a portion of a body of a user, a gesture, a proximity, or a hovering.

For example, the communication interface 170 establishes communication between the electronic device 101 and an external electronic device (e.g., a first external electronic device 102, a second external electronic device 104 or a server 106). For example, the communication interface 170 is connected to a network 162 via a wireless communication or a wired communication, and communicates with an external device (e.g., the electronic device 104 or the server 106).

For example, the wireless communication may be a cellular communication protocol. For example, the wireless communication may use at least one of Long Term Evolution (LTE), LTE Advanced (LTE-A), Code Division Multiple Access (CDMA), Wideband CDMA (WCDMA), Universal Mobile Telephone System (UMTS), Wireless Broadband (WiBro) and Global System for Mobile communications (GSM). A wired communication may include at least one of, for example, a Universal Serial Bus (USB), a High Definition Multimedia Interface (HDMI), Recommended Standard 232 (RS-232), and a Plain Old Telephone Service (POTS). The network 162 includes at least one of a communication network, for example, a computer network (e.g., Local Are Network (LAN) or Wireless LAN (WLAN)), the Internet and a telephone network.

Each of the external electronic devices 102 and 104 may be equal to or different from the electronic device 101. According to an embodiment of the present invention, the server 106 includes one or more groups of servers. According to an embodiment of the present invention, all or some of the operations executed in the electronic device 101 may be executed in another electronic device, or a plurality of other electronic devices (e.g., the electronic devices 102, 104 or the server 106). According to an embodiment of the present invention, when the electronic device 101 should perform a function or service automatically or by request, the electronic device 101 may refer at least some functions related to the function or the service to another electronic device (e.g., the electronic device 102, the electronic device 104 or the server 106) for the other electronic device to execute the function or service. Alternatively, the electronic device 101 may additionally refer at least some functions related to the function or the service to another electronic device (e.g., the electronic device 102, the electronic device 104 or the server 106). The other electronic device (e.g., the electronic device 102, the electronic device 104 or the server 106) executes the referred function or an additional function and transfers the result of executing the function to the electronic device 101. The electronic device 101 processes the received result as is or additionally processes the received result and provides the requested function or service. Accordingly, for example, cloud computing, distribution computing or client-server computing techniques may be used.

FIG. 1 illustrates that the electronic device 101 includes the communication interface 170 to communicate with the external electronic device 104, the server 106, or the like via the network 162. However, according to an embodiment of the present invention, the electronic device 101 may be implemented to operate independently in the electronic device 101 without a communication function.

According to an embodiment of the present invention, the server 106 drives the electronic device 101 by performing at least one operation (or function) among operations (or functions) implemented in the electronic device 101. For example, the server 106 may include a determining server module which supports the determining module 180 implemented in the electronic device 101. For example, the determining server module may include at least one element of the determining module 180 and perform (or replace) at least one operation among operations (or functions) performed by the determining module 180.

The determining module 180 processes at least some information obtained from other elements (e.g., the processor 120, the memory 130, the input/output interface 150 or the communication interface 170, and the like) and provides information to a user that was processed by various methods. Additional information on the determining module 180 is provided below with reference to FIG. 2.

Although the determining module 180 is illustrated as a module separated from the processor 120 in FIG. 1, at least some of the determining module 180 may be included in the processor 120 or at least another module, and all functions of the determining module 180 may be included in the processor 120 or another processor.

Figure 2:
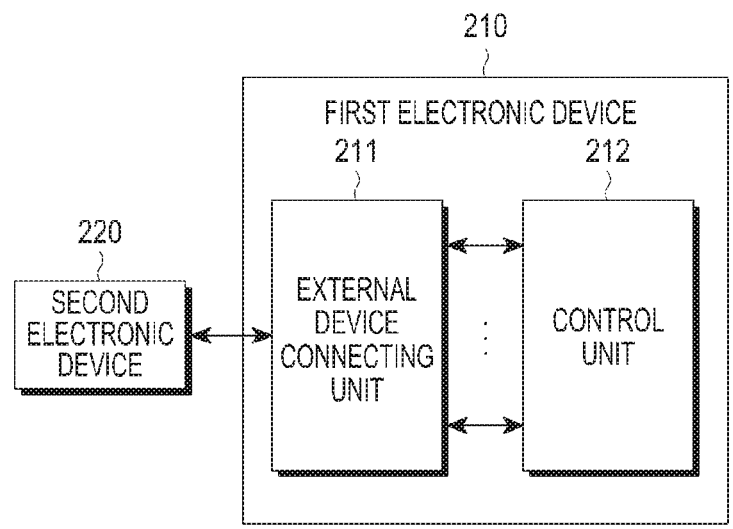
FIG. 2 is a block diagram of an electronic device according to an embodiment of the present invention.

FIG. 2 is a block diagram of an electronic device (e.g., the electronic device 101 including the determining module 180 of FIG. 1) according to an embodiment of the present invention. For convenience of description, an example in which the determining module 180 executes in the processor 120 is provided. At least one element in a control unit 212 of FIG. 2 may be in the determining module 180 or the processor 120 of FIG. 1.

Referring to FIG. 2, a first electronic device 210 include at least one of an external device connecting unit 211 and the control unit 212.

The first electronic device 210 is connected to a second electronic device 220 via the external device connecting unit 211. According to an embodiment of the present invention, the second electronic device 220 may be referred to as an "external electronic device" of the first electronic device 210.

The external device connecting unit 211 includes at least one connecting pin. A contact point included in a connecting unit of the second electronic device 220 is contacted to each pin of the external device connecting unit 211, and thus the first electronic device 210 and the second electronic device 220 are electrically connected.

When the first electronic device 210 is electrically connected to the second electronic device 220 via the external device connecting unit 211, the first electronic device 210 transmits data or power to the second electronic device 220 or receives data or power from the second electronic device 220. At least some of the external device connecting unit 211 may be included in the input/output interface 150 or the communication interface 170 of FIG. 1.

The control unit 212 of FIG. 2 controls the first electronic device 210 such that the first electronic device 210 communicates with the second electronic device 220 via the external device connecting unit 211, and processes data received from the second electronic device 220. At least some functions of the control unit 212 may be included in the determining module 180 or the processor 120 of FIG. 1.

According to an embodiment of the present invention, the control unit 212 is connected to at least one of the plurality of pins in the external device connecting unit 211. In addition, the control unit 212 is connected to an IDentification (ID) pin for detecting a connection or disconnection of the second electronic device 220 or detecting a type of the second electronic device 220 among the plurality of pins.

According to an embodiment of the present invention, the control unit 212 determines an abnormality or a normality of the external device connecting unit 211 by measuring a voltage or a resistance from the ID pin of the external device connecting unit 211 and compares the measured voltage or resistance with a predetermined voltage or resistance. Various embodiments in which the abnormality is determined are described in detail in or below descriptions of FIG. 3.

When the control unit 212 determines that the external connecting unit 211 is abnormal due to flooding, invasion of foreign particles and the like, the control unit 212 performs predetermined operations according to the result of the determination.

Figure 3:
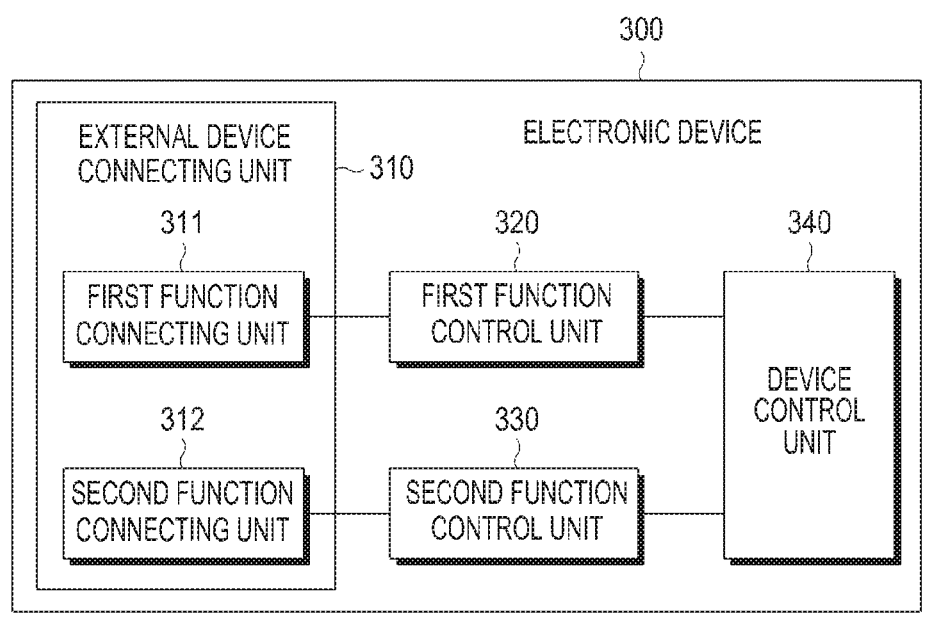
FIG. 3 is a block diagram of an electronic device according to an embodiment of the present invention.

FIG. 3 is a block diagram of an electronic device according to an embodiment of the present invention.

Referring to FIG. 3, the electronic device 300 according to an embodiment of the present invention includes at least one of an external device connecting unit 310, a first function control unit 320, a second function control unit 330 and a device control unit 340.

The external device connecting unit 310 includes a first function connecting unit 311 and a second function connecting unit 312. The external device connecting unit 310 include a plurality of connecting pins and forms one physical connecting unit. The plurality of pins in the external device connecting unit 310 are divided into a plurality of connecting pins according to functions thereof. For example, at least one pin for a first function among a plurality of functions forms the first function connecting unit 311, and at least one pin for a second function among the plurality of functions forms the second function connecting unit 312. The first function connecting unit 311 and the second function connecting unit 312 are divided by arranging the plurality of pins at an upper portion and a lower portion or at a left side or a right side in the one physical external device connecting unit 310.

Figure 4:
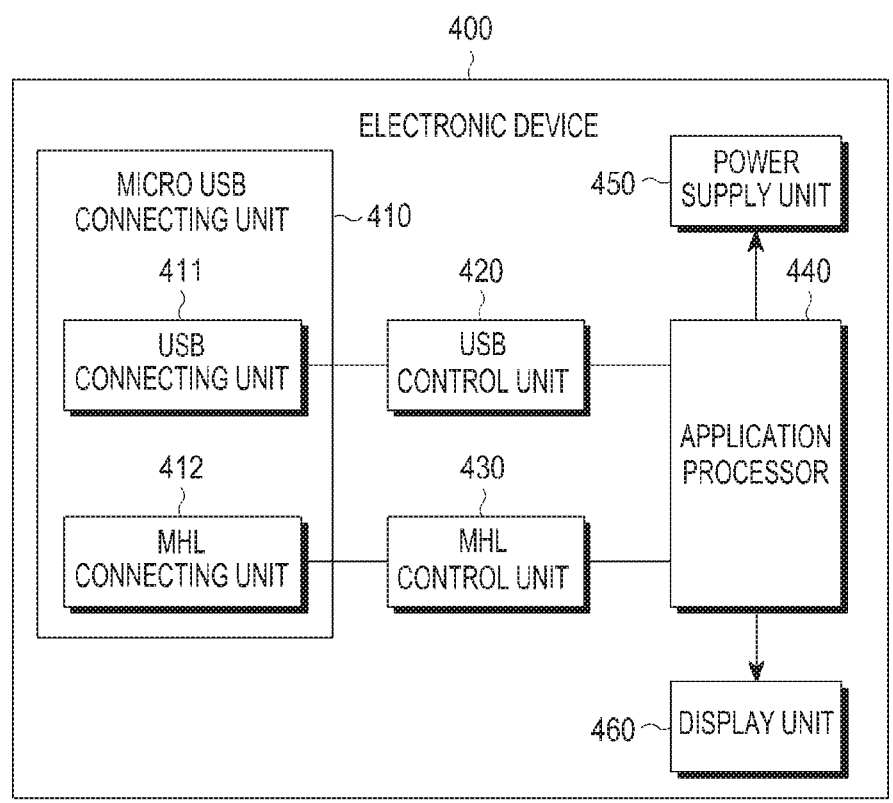
FIG. 4 is a block diagram of an electronic device according to an embodiment of the present invention.

For example, as shown in FIG. 4, the first function connecting unit 311 may be a USB connecting unit 411 corresponding to a USB function, and the second function connecting unit 312 may be a Mobile High-definition Link (MHL) connecting unit 412 corresponding to an MHL function. The external device connecting unit 310 may be a micro USB connecting unit, where some of a plurality of pins in the micro USB connecting unit are for the USB function, and where others of the plurality of pins are for the MHL function.

At least one pin in the first function connecting unit 311 in FIG. 3 is connected to the first function control unit 320, and at least one pin in the second function connecting unit 312 is connected to the second function control unit 330. In addition, the first function connecting unit 320 and the second function control unit 330 are directly or indirectly connected to each other.

The first function control unit 320 transmits or receives power to or from each pin of the first function connecting unit 311, and is connected to a first ID pin for detecting a connection or a disconnection of an external device via the external device connecting unit 310 or the type of the connected external device, among the plurality of pins. According to an embodiment of the present invention, the first function control unit 320 determines the connection or the disconnection of the external device connected to the external device connecting unit 310 or the type of the external device by measuring a voltage or a resistance from the first ID pin of the first function connecting unit 311 and compares the measured voltage or resistance to a predetermined voltage or resistance.

The second function control unit 330 transmits or receives power to or from each pin of the second function connecting unit 312, and is connected to a second ID pin for detecting the connection or the disconnection of the external device via the external device connecting unit 310 or the type of the connected external device, among the plurality of pins. According to an embodiment of the present invention, the second function control unit 330 determines the connection or the disconnection of the external device connected to the external device connecting unit 310 or the type of the external device by measuring a voltage or a resistance from the second ID pin of the second function connecting unit 312 and compares the measured voltage or resistance with a predetermined voltage or resistance.

According to an embodiment of the present invention, it is assumed that the external device connecting unit 310 is a micro USB connecting unit, where the first function connecting unit 311 is a USB connecting unit, and the second function connecting unit 312 is an MHL connecting unit. In addition, the first function control unit 320 is a USB control unit, and the second function control unit 330 is an MHL control unit.

The device control unit 340 is connected to the first function control unit 320 and/or the second function control unit 330, and provides control signals related to each function to the first function control unit 320 and/or the second function control unit 330. In addition, the device control unit 340 generates a signal for controlling the electronic device from data or a signal received from the first function control unit 320 and/or the second function control unit 330 and controls various functions of the electronic device 300.

According to an embodiment of the present invention, the first function control unit 320 measures a voltage or a resistance from the first ID pin of the first function connecting unit 311 and provides the measured voltage or resistance to the device control unit 340 as an analog signal or a digital signal. In addition, the second function control unit 330 measures a voltage or a resistance from the second ID pin of the second function connecting unit 312 and provides the measured voltage or resistance to the device control unit 340 as an analog signal or a digital signal.

According to an embodiment of the present invention, the device control unit 340 determines whether the external device connecting unit 310 is abnormal or normal based on the value measured from the first ID pin and the value measured from the second ID pin provided from the first function control unit 320 and the second function control unit 330, respectively. For example, when the device control unit 340 determines that the external device connecting unit 310 is abnormal by comparing the value measured from the first ID pin and the value measured from the second ID pin to a predetermined reference, the device control unit 340 performs a function corresponding to the abnormality. For example, when the device control unit 340 determines that the external device connecting unit 310 is abnormal, the device control unit 340 may block a supply of power via at least one pin among the plurality of pins in the external device connecting unit 310. In addition, when the device control unit 340 determines that the external device connecting unit 310 is abnormal, the device control unit 340 may display the abnormality on a screen to inform the user of the abnormality.

In addition, when the device control unit 340 determines that the external device connecting unit 310 is abnormal, the device control unit 340 may block power or a current provided to at least one circuit in the electronic device 300, and may turn off the power to the electronic device 300.

Meanwhile, in the an embodiment of the present invention, each module unit or module may refer to hardware for executing the technical spirit of an embodiment of the present invention and a functional and structural combination of software for driving the hardware. For example, each function unit or module may refer to predetermined code and a unit of logic of a hardware resource for performing the predetermined code. However, it will be understood by a person skilled in the technical field of the present invention that each functional unit may not refer to the physically edited codes or a kind of hardware.

FIG. 4 is a block diagram of an electronic device according to an embodiment of the present invention.

Referring to FIG. 4, the electronic device 400, according to an embodiment of the present invention includes at least one of a micro USB connecting unit 410, a USB control unit 420, an MHL control unit 430, an application processor 440, a power supply unit 450 and a display unit 460.

The micro USB connecting unit 410 includes a USB connecting unit 411 and an MHL connecting unit 412. The micro USB connecting unit 410 includes a plurality of connecting pins (e.g., 11 pins) and physically forms one connecting unit. The plurality of pins (e.g., 11 pins) in the micro USB connecting unit 410 is divided into the USB connecting unit 411 and the MHL connecting unit 412 according to functions thereof.

For example, the USB connecting unit 411 includes at least one pin among a Vbus pin, a D– pin, a D+ pin, an ID pin and a GrouND (i.e., GND) pin. According to an embodiment of the present invention, at least one pin in the USB connecting unit 411 is omitted or at least one pin is added to the USB connecting unit 411. Each pin of the micro USB connecting unit 410 may be a pin supporting a communication according to at least one protocol. For example, the protocol may be a USB protocol, a micro USB protocol, and the like, but an embodiment of the present invention is not limited thereto.

For example, the electronic device 400 provides power to a connected external electronic device via the Vbus pin. In addition, the electronic device 400 transmits and/or receives data to or from the external electronic device via the D– pin or the D+ pin. In addition, the electronic device 400 determines whether the external electronic device is connected or not, a type of the connected electronic device 400, and the like via the ID pin.

For example, when the external electronic device 400 is connected via the micro USB connecting unit 410 and the ID pin of the USB connecting unit 411 is in a floating state, the external electronic device is operated in a client mode. In addition, when the ID pin is in a short circuit state, the external electronic device is operated in a host mode or an On-The-Go (OTG) mode.

For example, according to an embodiment of the present invention, the functions of each pin are configured as shown in Table 1 below. But, the various embodiments of the present invention are not limited to Table 1 below.

TABLE 1

| Contact Number | Signal Name | Typical Wiring Assignment |
| --- | --- | --- |
| 1 | VBUS | Red |
| 2 | D– | White |
| 3 | D– | Green |
| 4 | ID | <Ra_PLUG_ID |
| 5 | GND | Black |
| Shell | Shield | Drain Wire |

At least one pin (e.g., five pins) in the USB connecting unit 411 is connected to the USB connecting unit 420, at last one pin in the MHL connecting pin 412 is connected to the MHL control unit 430. The USB control unit 420 transmits or receives a signal to or from each pin of the USB connecting unit 411, and is connected to a first ID pin for detecting a connection or a disconnection of an external device via the micro USB connecting unit 410 or a type of the connected external device, among the plurality of pins. The USB control unit 420 may be formed of a Micro USB interface Integrated Circuit (MUIC).

The USB control unit 420 measures a voltage or a resistance from the first ID pin so as to determine which external device or cable is connected to the USB connecting unit 411 of the micro USB connecting unit 410. The analog signal of a measured resistance is converted into a digital signal by an Analog-to-Digital Converter (ADC) in the USB control unit 420, and the voltage or the resistance which is converted into the digital signal is provided to the application processor 440.

For example, the connected external device is determined from the resistance converted in the USB control unit 420 as shown in Table 2 below.

TABLE 2

| ID Resistor (ohms) | Description |
| --- | --- |
| GND | USB_OTG |
| 75 | Audio Video Cable with load |
| 1K | MHL cable |
| 2K | SEND/END Button |
| 2.064K | Remote S1 Button |
| 3.208K | Remote S2 Button |
| 4.014K | Remote S3 Button |
| 4.82K | Remote S4 Button |
| 6.03K | Remote S5 Button |
| 8.03K | Remote S6 Button |
| 10.03K | Remote S7 Button |
| 12.30K | Remote S8 Button |
| 14.46K | Remote S9 Button |
| 17.26K | Remote S10 Button |
| 20.5K | Remote S11 Button |
| 24.07K | Remote S12 Button |
| 28.7K | Reserved Accessory 1 |
| 34K | Reserved Accessory 2 |
| 40.2K | Reserved Accessory 3 |
| 49.9K | Reserved Accessory 4 |
| 64.9K | Reserved Accessory 5 |
| 80.07K | CEA936 Audio Mode |
| 102K | Phone Powered Device |
| 212K | TTY Converter |
| 150K | UART Cable |
| 200K | Consumer Electronics Association 936A (CEA-936A) Type 1 Charger |
| 255K | Factory Mode USB |
| 301K | Factory Mode USB |
| 365K | Audio Video Cable with no load |
| 442K | CEA-936A Type 2 Charger |
| 523K | Factory Mode Universal Asynchronous Receiver Transmitter (UART) |
| 619K | Factory Mode UART |
| 1000K | Audio Mode with Remote |
| Open | USB, Dedicated Charger or Accessroy removal |

In addition, the MHL control unit 430 transmits or receives signals to or from each pin of the MHL connecting unit 412, and is connected to a second ID pin for detecting the connection or the disconnection of the external device via the micro USB connecting unit 410 or the type of the connected external device, among the plurality of pins. The MHL control unit 430 is formed of an MHL interface IC (MHLIC).

The MHL control unit 430 measures a voltage or a resistance from the second ID pin to determine which external device or cable is connected to the MHL connecting unit 412 of the micro USB connecting unit 410. The measured analog signal of a voltage or resistance is provided from the MHL control unit 430 to the application processor 440. The application processor 440 converts the analog signal of a voltage or resistance provided from the MHL control unit 430 into a digital signal of the voltage or resistance by an Analog-to-Digital Converter (ADC). For example, an ID signal output node of the MHL control unit 430 is connected to an ADC port of the application processor 440. For example, the connected external device is determined from the voltage or resistance converted in the MHL control unit 430.

According to an embodiment of the present invention, the application processor 440 determines the type of the external device connected to the micro USB connecting unit 410 from the digital representation of voltage or resistance provided via the USB control unit 420 and the analog representation of voltage or resistance provided via the MHL control unit 430, and determines whether the micro USB connecting unit 410 is flooded with water or not, or the micro USB connecting unit 410 is invaded or not.

For example, the application processor 440 measures resistances as shown in Table 3 below, when a cable is connected to the micro USB connecting unit 410 in a normal state.

TABLE 3

|  | USB_ID(first ID pin) | MHL_ID(second ID pin) |
| --- | --- | --- |
| OTG cable connecton | 0 ohm | Open |
| MHL cable connecton | 1K ohm | 1K ohm |

For example, the resistance of the first ID pin and the resistance of the second ID pin determined by the application processor 440 indicate values of Table 3 above, where it is determined that the cable is normally connected to the micro USB connecting unit 410.

When water invades the micro USB connecting unit 410 or the micro USB connecting unit 410 is flooded with water, the water contacts at least one pin (e.g., 11 pins) of the micro USB connecting unit 410, and thus all resistances between pins may be reduced.

For example, when an OTG cable is normally connected to the micro USB connecting unit 410, a resistance of a USB_ID is measured as 0 ohm and a resistance of an MHL_ID is measured as an open state as shown in Table 3 above. However, when the micro USB connecting unit 410 is flooded with water, all resistances of the USB_ID and the MHL_ID are changed into a constant value (e.g., from about 8K ohm to 0 ohm).

As a result of an experiment, when salt water of 3% is injected into an existing micro USB connecting unit 410, a resistance of an ID pin in the existing USB connecting unit 410 is recognized as 8K ohm as soon as the salt water is injected, and the resistance is recognized as 0 ohm after about 20 minutes. Therefore, it may be recognized that the OTG cable is connected when it is not connected. For example, corrosion may occur due to a minute current provided to the USB_ID pin of the micro USB connecting unit 410 in order to recognize the OTG as described above, and thus the electronic device 400 may be abnormally operated.

In an embodiment of the present invention, it may be determined whether it is the connection of the OTG cable desired by a user or an incorrect determination due to the invasion by connecting a resistance output node of the ID pin in the MHL control unit 430 to the ADC port of the application processor 440 and comparing the resistance measured in the ID pin of the USB connecting unit 411 and the resistance measured in the ID pin of the MHL connecting unit 412 with predetermined values by the application processor 440.

When the application processor 440 determines there is an invasion or flooding as a result of comparing the resistances measured in the ID pins, since the OTG cable is not connected, the application processor 440 controls the power supply unit 450 to not output power to a power supply pin (e.g., the Vbus pin) of the USB connecting unit 411 or the MHL connecting unit 412. The power output to the power supply pin is controlled, therefore corrosion of the power supply pin can be prevented and unnecessary loss of power or a discharge of a battery can be prevented. In addition, a malfunction of an electronic device can be prevented.

According to an embodiment of the present invention, when the resistance of the ID pin is measured in various invasion states such as fresh water, seawater, and the like are stored in a table, corrosion of the ID pin or an invasion state of the micro USB connecting unit may be determined by checking the ID resistance in each corresponding invasion state. For example, when a resistance is less than a predetermined resistance which is stored in a table by a value greater than or equal to a predetermined value, it is determined that the ID pin is corroded.

In addition, according to an embodiment of the present invention, when the application processor 440 determines that the micro USB connecting unit 410 is abnormal, the application processor 440 checks whether the micro USB connecting unit 410 is continuously abnormal by periodically and repeatedly determining whether the micro USB connecting unit 410 is abnormal. When the abnormal state is maintained for a predetermined period as a result of the repeat determination, various predetermined operations (e.g., providing a warning on a screen to a user via the display unit 460, automatically turning off power, and the like) are performed.

An electronic device, according to an embodiment of the present invention, may include an external device connecting unit that comprises a first function connecting unit and a second function connecting unit, the first function connecting unit including a first identification (ID) pin for detecting a connection with an external electronic device, the second function connecting unit including a second ID pin for detecting a connection with the external electronic device, and a processor that determines that an abnormality occurs in the external device connecting unit when values measured from the first ID pin and the second ID pin satisfy a predetermined condition.

According to an embodiment of the present invention, the external device connecting unit is a connecting unit according to a micro USB protocol.

According to an embodiment of the present invention, the first function connecting unit is a connecting unit according to a USB protocol, and the second function connecting unit is a connecting unit according to a Mobile High-definition Link (MHL) protocol.

According to an embodiment of the present invention, a value measured from the first ID pin is a voltage or a resistance, and a value measured from the second ID pin is a voltage or a resistance.

According to an embodiment of the present invention, the processor determines that an abnormality occurs in the external device connecting unit when changes of the values measured from the first ID pin and the second ID pin satisfy a predetermined condition.

According to an embodiment of the present invention, the processor turns off power to the electronic device in correspondence with determining an abnormality occurrence.

According to an embodiment of the present invention, the processor controls a display of an abnormality or a normality on a screen in correspondence with determining an abnormality occurrence.

According to an embodiment of the present invention, the processor repeatedly performs a determination of an abnormality or a normality in a predetermined period when the processor determines that an abnormality occurs in the external device connecting unit.

According to an embodiment of the present invention, the electronic device further includes a first function control unit that is connected to at least one pin in the first function connecting unit, converts an analog ID value measured from the first ID pin of the first function connecting unit into a digital ID value, and provides the digital ID value to the processor.

According to an embodiment of the present invention, the electronic device includes a first function control unit that is connected to at least one pin in the second function connecting unit, and provides an analog ID value measured from the second ID pin of the second function connecting unit to an Analog-to-Digital Converter (ADC) port of the processor.

Figure 5:
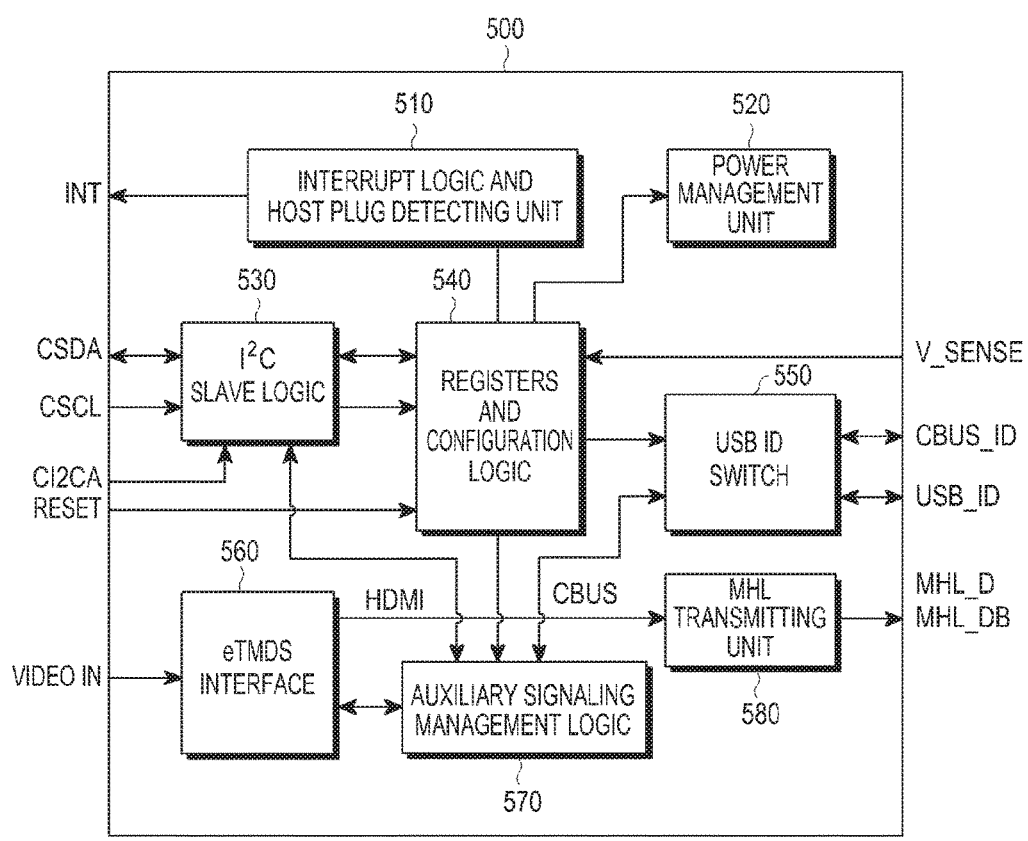
FIG. 5 is a block diagram of a Mobile High-definition Link (MHL) control unit according to an embodiment of the present invention.

FIG. 5 is a block diagram of an MHL control unit 500 according to an embodiment of the present invention.

Referring to FIG. 5, the MHL control unit 500, according to an embodiment of the present invention, includes at least one of an interrupt logic and host plug detecting unit 510, a power management unit 520, an Inter-Integrated Circuit (I²C) slave logic 530, a registers and configuration logic 540, a USB ID switch 550, an eTransition Miminized Differential Signaling (eTMDS) interface 560, an auxiliary signaling management logic 570 and an MHL transmitting unit 580.

A video input signal input to the MHL control unit 500 is input to the eTMDS interface 560, converted into an HDMI signal, and transmitted to other elements via the MHL transmitting unit 580. The auxiliary signaling management logic 570 provides an auxiliary signal to the eTMDS interface 560, the I²C slave logic 530, and the like under control of the registers and configuration logic 540. In addition, the auxiliary signaling management logic 570 transmits or receives a CBUS signal to and from the USB ID switch 550.

The interrupt logic and host plug detecting unit 510 outputs an interrupt signal by a control signal of the registers and configuration logic 540. In addition, the registers and configuration logic 540 provides a control signal to the power management unit 520 to control a power supply of the MHL control unit 500.

According to an embodiment of the present invention, the registers and configuration logic 540 provides a switching control signal to the USB ID switch 550. The USB ID switch 550 receives the switching control signal from the registers and configuration logic 540 and may switch and output the input signal. For example, the USB ID switch 550 may receive an MHL_ID signal from an ID pin of an MHL connecting unit and may bypass and output the received MHL_ID signal according to the control signal of the registers and configuration logic 540. For example, according to an embodiment of the present invention, an analog signal representing resistance measured from the ID pin of the MHL connecting unit is input to the USB ID switch 550 of the MHL control unit 500. The USB ID switch 550 provides the analog resistance of the ID pin to an ADC port of an application processor.

According to an embodiment of the present invention, as described above, the application processor determines the micro USB connecting unit 410 is abnormal or not from an analog signal representing resistance of the ID pin of the MHL connecting unit 412 provided from the MHL control unit 430 and the digital signal representing resistance of the ID pin of the USB connecting unit 411 provided from the USB control unit 420.

Hereinafter, a method of determining an abnormality or a normality in an electronic device described above is described in detail with reference to FIGS. 6 and 7.

Figure 6:
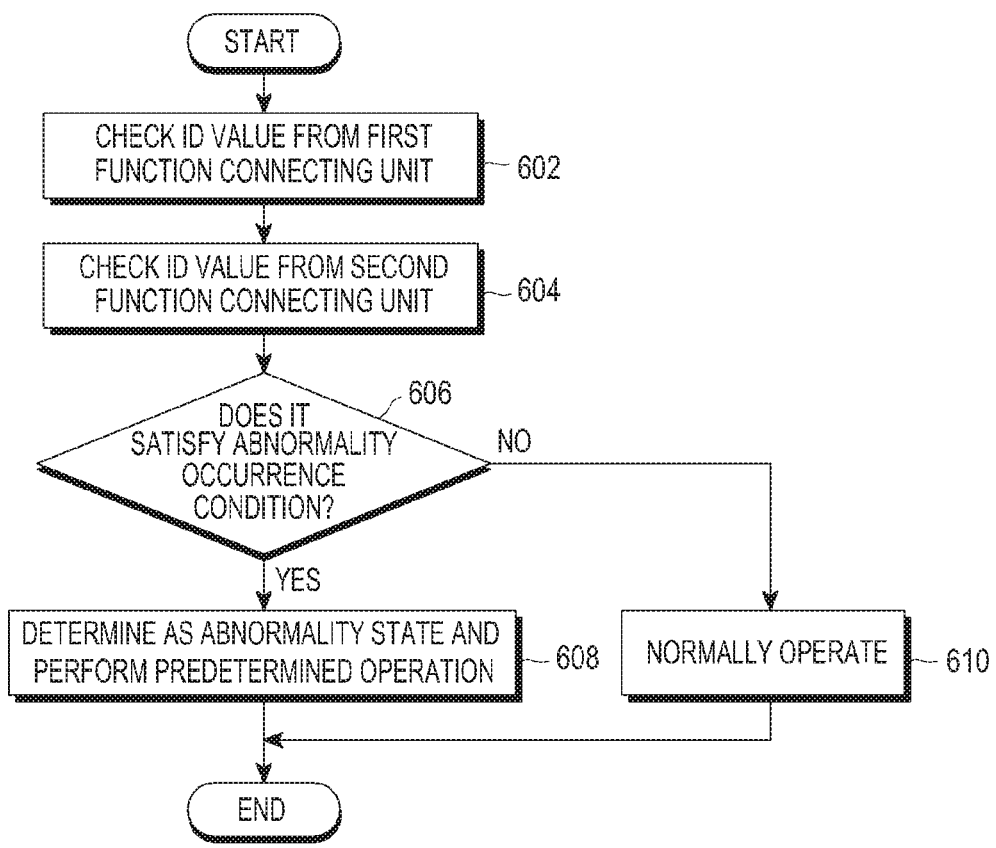
FIG. 6 is a flowchart of a method of determining an abnormality or a normality of a connecting unit in an electronic device according to an embodiment of the present invention.

FIG. 6 is a flowchart of a method of determining an abnormality or a normality of a connecting unit in an electronic device according to an embodiment of the present invention.

Referring to FIG. 6, in step 602, an ID value (e.g., a measured voltage or a measured resistance) measured from a first function connecting unit is checked. In step 604, an ID value (e.g., a measured voltage or a measured resistance) measured from a second function connecting unit is checked.

In step 606, each ID value measured from the first function connecting unit and the second function connecting unit is determined to satisfy a predetermined abnormality occurrence condition or not.

In step 608, when it is determined in step 606 that each ID value measured from the first function connecting unit and the second function connecting unit satisfies a predetermined abnormality occurrence condition, it is determined to be an abnormal state and a configured operation (e.g., an abnormality state notification display on a screen, a block of a power supply to an external device connecting unit, and the like) is performed.

In step 610, when it is determined in step 606 that each ID value measured from the first function connecting unit and the second function connecting unit is within a predetermined normality condition, a normal operation is performed.

Figure 7:
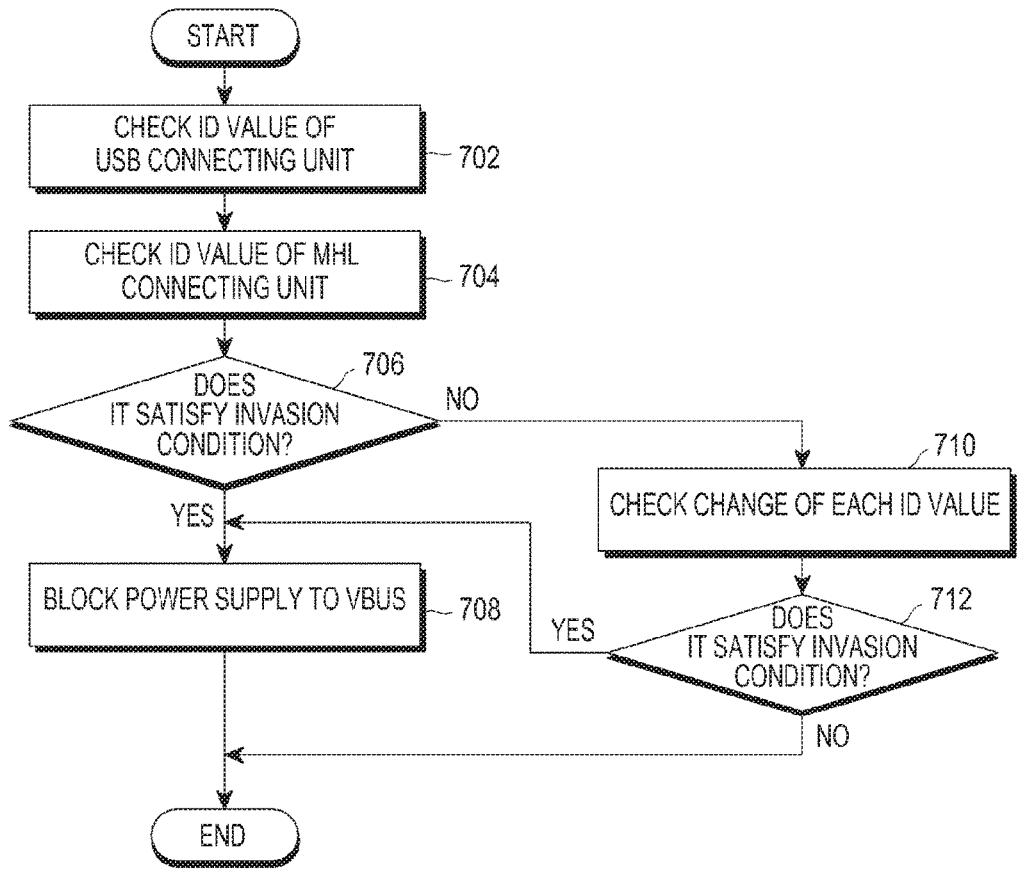
FIG. 7 is a flowchart of a method of determining an abnormality or a normality of a connecting unit in an electronic device according to an embodiment of the present invention.

FIG. 7 is a flowchart of a method of determining an abnormality or a normality of a connecting unit in an electronic device according to an embodiment of the present invention.

Referring to FIG. 7, in step 702, an ID value (e.g., a measured voltage or a measured resistance) measured from a USB connecting unit is checked.

In step 704, an ID value (e.g., a measured voltage or a measured resistance) measured from an MHL connecting unit is checked.

In step 706, each ID value measured from the USB connecting unit and the MHL connecting unit is determined to satisfy a predetermined abnormality occurrence condition (e.g., an invasion condition) or not.

In step 708, when it is determined in step 706 that an abnormal state exists, a configured operation (e.g., a block of a power supply to a Vbus pin and the like) is performed.

In step 710, when it is determined in step 706 that each ID value measured from the USB connecting unit and the MHL connecting unit does not satisfy a predetermined invasion condition, a change of each ID value is checked.

As a result of checking the change of each ID value, in step 712, when the change of the each ID value satisfies an invasion condition, in step 708, it is determined as an abnormal state and a configured operation (e.g., block of a power supply to a Vbus pin and the like) is performed.

At least one of the steps shown in FIGS. 6 and 7 may be omitted and at least one step may be added to the steps of FIGS. 6 and 7. In addition, the steps shown in FIG. 6 or FIG. 7 may be performed in the shown sequence. Alternatively, a performance sequence of at least one step may be exchanged with a performance sequence of another step.

A method of an operation of an electronic device, according to an embodiment of the present invention, includes checking a value measured from a first identification (ID) pin which is included in a first function connecting unit of an external device connecting unit and is for detecting a connection with an external electronic device, checking a value measured from a second ID pin which is included in a second function connecting unit of the external device connecting unit and is for detecting the connection with the external electronic device, and determining the abnormality occurs in the external device connecting unit when the values measured from the first ID pin and the second ID pin satisfy a predetermined condition.

According to an embodiment of the present invention, the external device connecting unit is a connecting unit according to a micro USB protocol.

According to an embodiment of the present invention, the first function connecting unit is a connecting unit according to a USB protocol, and the second function connecting unit is a connecting unit according to an MHL protocol.

According to an embodiment of the present invention, the value measured from the first ID pin is a voltage or a resistance, and the value measured from the second ID pin is a voltage or a resistance.

According to an embodiment of the present invention, determining that the abnormality occurs in the external device connecting unit includes determining that the abnormality occurs in the external device connecting unit when changes of the values measured from the first ID pin and the second ID pin satisfy a predetermined condition.

According to an embodiment of the present invention, the method further includes turning off power to the electronic device in accordance with the determination of the abnormality occurrence.

According to an embodiment of the present invention, the method further includes displaying the abnormality or the normality on a screen in accordance with the determination of the abnormality occurrence.

According to an embodiment of the present invention, the method further includes repeatedly performing the determination of the abnormality or the normality in a predetermined period when it is determined that the abnormality occurs in the external device connecting unit.

According to an embodiment of the present invention, the method further includes receiving an analog ID value measured from the first ID pin of the first function connecting unit, from a first function control unit connected to at least one pin in the first function connecting unit, and converting the received analog ID value into a digital ID value and providing the digital ID value to a processor.

According to an embodiment of the present invention, the method further includes providing an analog ID value, which is measured from the second ID pin of the second function connecting unit, from a second function control unit connected to at least one pin in the second function connecting unit to an ADC port of a processor.

Figure 8:
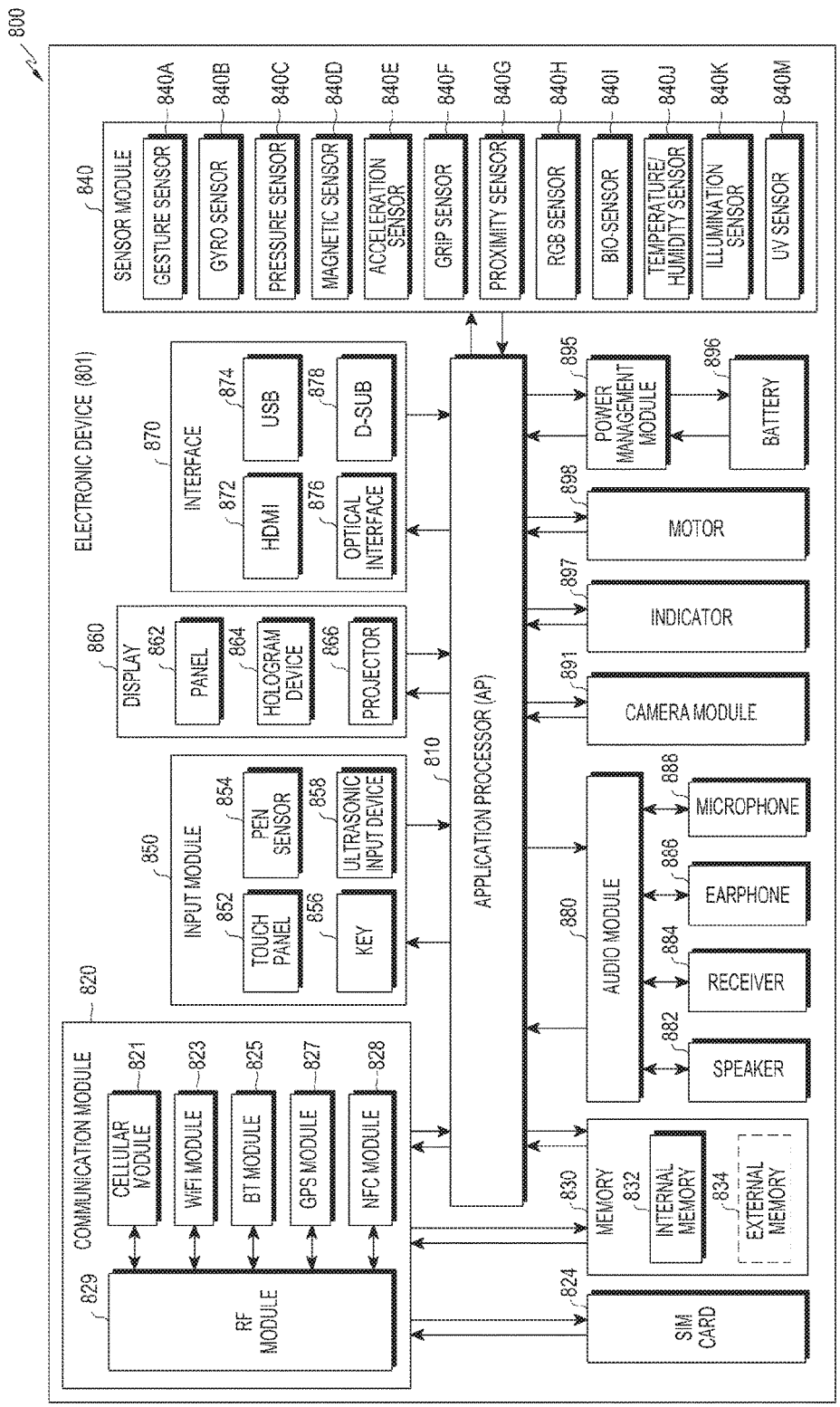
FIG. 8 is a block diagram of an electronic device according to an embodiment of the present invention.

FIG. 8 is a block diagram 800 of an electronic device 801 according to an embodiment of the present invention. The electronic device 801 includes, for example, all or some of the electronic device 101 shown in FIG. 1. The electronic device 801 of FIG. 8 includes at least one Application Processor (AP) 810, a communication module 820, a Subscriber Identifier Module (SIM) card 824, a memory 830, a sensor module 840, an input module 850, a display 860, an interface 870, an audio module 880, a camera module 891, a power management module 895, a battery 896, an indicator 897, and a motor 898.

The AP 810 controls a plurality of hardware or software components connected to the AP 810 by driving an operating system or an application program, processes various data and performs calculations. The AP 810 may be implemented by, for example, a System on Chip (SoC). According to an embodiment of the present invention, the AP 810 further includes a Graphics Processing Unit (GPU) and/or an image signal processor. The AP 810 may also include at least some elements (e.g., a cellular module 821) shown in FIG. 8. The AP 810 loads a command or data received from at least one other element (e.g., a nonvolatile memory) in a volatile memory to process the command or data and stores various data in the nonvolatile memory.

The communication module 820 includes a cellular module 821, a Wireless Fidelity (Wi-Fi) module 823, a Bluetooth (BT) module 825, a Global Positioning System (GPS) module 827, a Near Field Communication (NFC) module 828, and a Radio Frequency (RF) module 829.

The cellular module 821 provides a voice call, a video call, a Short Message Service (SMS), or an Internet service via a communication network. According to an embodiment of the present invention, the cellular module 821 distinguishes and authenticates the electronic device 801 within a communication network using, for example, SIM card 824. According to an embodiment of the present invention, the cellular module 821 performs at least a part of the functions provided by the AP 810. For example, the cellular module 821 may include a Communication Processor (CP).

Each of the Wi-Fi module 823, the BT module 825, the GPS module 827, and the NFC module 828 may include, for example, a processor for processing data transmitted/received via the corresponding module. According to an embodiment of the present invention, at least some (for example, two or more) of the cellular module 821, the WiFi module 823, the BT module 825, the GPS module 827, and the NFC module 828 may be included in one Integrated Circuit (IC), or chip, or one IC package.

The RF module 829 transmits/receives data, for example, a communication signal (e.g., an RF signal). For example, the RF module 829 includes a transceiver, a Power Amplifier Module (PAM), a frequency filter, a Low Noise Amplifier (LNA), an antenna, or the like. According to an embodiment of the present invention, at least one of the cellular module 821, the Wi-Fi module 823, the BT module 825, the GPS module 827, and the NFC module 828 transmits/receives the RF signal via a separate RF module.

The SIM card 824 includes, for example, a card including a Subscriber Identification Module and/or an embedded SIM, and may include unique identification information (for example, an Integrated Circuit Card IDentifier (ICCID)) or subscriber information (for example, an International Mobile Subscriber Identity (IMSI)).

The memory 830 (e.g., the memory 130) includes, for example, an internal memory 832 or an external memory 834. The internal memory 832 includes, for example, at least one of a volatile memory (e.g., a Dynamic Random Access Memory (DRAM), a Static RAM (SRAM), a Synchronous Dynamic RAM (SDRAM), and the like), a non-volatile memory (e.g., a One Time Programmable Read Only Memory (OTPROM), a Programmable ROM (PROM), an Erasable and Programmable ROM (EPROM), an Electrically Erasable and Programmable ROM (EEPROM), a mask ROM, a flash ROM (e.g., a NAND flash memory, a NOR flash memory, and the like)), a hard drive, and a Solid State Drive (SSD).

The external memory 834 further includes a flash drive, for example, a Compact Flash (CF), a Secure Digital (SD) memory card, a Micro Secure Digital (Micro-SD) memory card, a Mini Secure Digital (Mini-SD) memory card, an eXtreme Digital (xD) memory card, a memory stick, or the like. The external memory 834 may be functionally and/or physically connected with the electronic device 801 via various interfaces.

The sensor module 840 measures a physical quantity or detects an operation state of the electronic device 801, and converts the measured or detected information to an electrical signal. The sensor module 840 includes, for example, at least one of a gesture sensor 840A, a gyro sensor 840B, a pressure sensor 840C, a magnetic sensor 840D, an acceleration sensor 840E, a grip sensor 840F, a proximity sensor 840G, a color sensor 840H (for example, Red, Green, and Blue (RGB) sensor), a biometric sensor 840I, a temperature/humidity sensor 840J, an illumination sensor 840K, and an Ultra Violet (UV) light sensor 840M. Additionally or alternatively, the sensor module 840 includes, for example, an Electronic-nose (E-nose) sensor, an ElectroMyoGraphy (EMG) sensor, an ElectroEncephaloGram (EEG) sensor, an ElectroCardioGram (ECG) sensor, an InfraRed (IR) sensor, an iris sensor and/or a fingerprint sensor. The sensor module 840 further includes a control circuit for controlling one or more sensors included therein. In an embodiment of the present invention, the electronic device 801 further include a processor for controlling the sensor module 840 as a part of the AP 810 or as an element separated from the AP 810 to control the sensor module 840 while the AP 810 is in a sleep state.

The input module 850 includes a touch panel 852, a (digital) pen sensor 854, a key 856, or an ultrasonic input device 858. The touch panel 852 uses at least one of a capacitive type, a resistive type, an infrared type, and an ultrasonic wave type. The touch panel 852 further includes a control circuit. The touch panel 852 further includes a tactile layer to provide a tactile reaction to the user.

For example, the (digital) pen sensor 854 may be a part of the touch panel or a separate recognition sheet. The key 856 includes, for example, a physical button, an optical key or a keypad. The ultrasonic input device 858 identifies data by detecting an acoustic wave with a microphone 888 of the electronic device 801 through an input unit generating an ultrasonic signal.

The display 860 (e.g. the display 160) includes a panel 862, a hologram device 864, or a projector 866. The panel 862 is equal to or similar to the display 160 shown in FIG. 1. The panel 862 may be implemented to be, for example, flexible, transparent, or wearable. The panel 862 may be also configured as one module together with the touch panel 852. The hologram 864 displays a stereoscopic image in the air using the interference of light. The projector 866 projects light onto a screen to display an image. The screen may be located, for example, internally or externally to the electronic device 801. According to an embodiment of the present invention, the display 860 further includes a control circuit for controlling the panel 862, the hologram device 864, or the projector 866.

The interface 870 includes, for example, a High-Definition Multimedia Interface (HDMI) 872, a USB 874, an optical interface 876, or a D-subminiature (D-sub) connector 878. The interface 870 may be included in, for example, the communication interface 170 illustrated in FIG. 1. Additionally or alternatively, the interface 670 includes, for example, an MHL interface, a Secure Digital (SD) card/Multi-Media Card (MMC) interface, or an Infrared Data Association (IrDA) standard interface.

The audio module 880 bilaterally converts a sound and an electrical signal. At least some elements of the audio module 880 may be included in, for example, the input/output interface 150 illustrated in FIG. 1. The audio module 880 processes sound information input or output via, for example, the speaker 882, the receiver 884, the earphone 886, the microphone 888 or the like.

The camera module 891 is a device for capturing a still image or a video, and, according to an embodiment of the present invention, includes one or more image sensors (e.g., a front sensor or a rear sensor), a lens, an Image Signal Processor (ISP), or a flash (e.g., a Light Emitting Diode (LED) or a xenon lamp).

The power managing module 895 manages power of the electronic device 801. According to an embodiment of the present invention, the power management module 895 includes a Power Management Integrated Circuit (PMIC), a charger Integrated Circuit (IC), a battery, or a power gauge. The PMIC may have a wired charging method and/or a wireless charging method. A magnetic resonance scheme, a magnetic induction scheme, or an electromagnetic scheme may be exemplified as the wireless charging method, and an additional circuit for a wireless charging, such as a coil loop circuit, a resonance circuit, a rectifier circuit, and the like, may be included in the wireless charging method. The power gauge may measure, for example, a remaining quantity of the battery 896, a voltage, a current or a temperature during charging. The battery 896 includes, for example, a rechargeable battery or a solar battery.

The indicator 897 displays a status of the electronic device 801 or a part (e.g. the AP 810) of the electronic device 801, for example, a booting status, a message status, a charging status, and the like. The motor 898 converts an electrical signal to a mechanical vibration, and generates an effect of a vibration or a haptic. The electronic device 801 may include a processing device (e.g., a Graphics Processing Unit (GPU)) for supporting a mobile TV. The processing device for supporting the mobile TV processes, for example, media data according to a standard of Digital Multimedia Broadcasting (DMB), Digital Video Broadcasting (DVB), media flow or the like.

Each of the components of the electronic device 801, according to the present invention, may be implemented by one or more components and the name of the corresponding component may vary depending on a type of the electronic device 801. The electronic device 801, according to the present invention, includes one or more of the aforementioned components, may further include other additional components, or some of the aforementioned components may be omitted. Further, some of the elements of the electronic device 801, according to an embodiment of the present invention, may be coupled to form a single entity while performing the same functions as those of the corresponding elements before the coupling.

Figure 9:
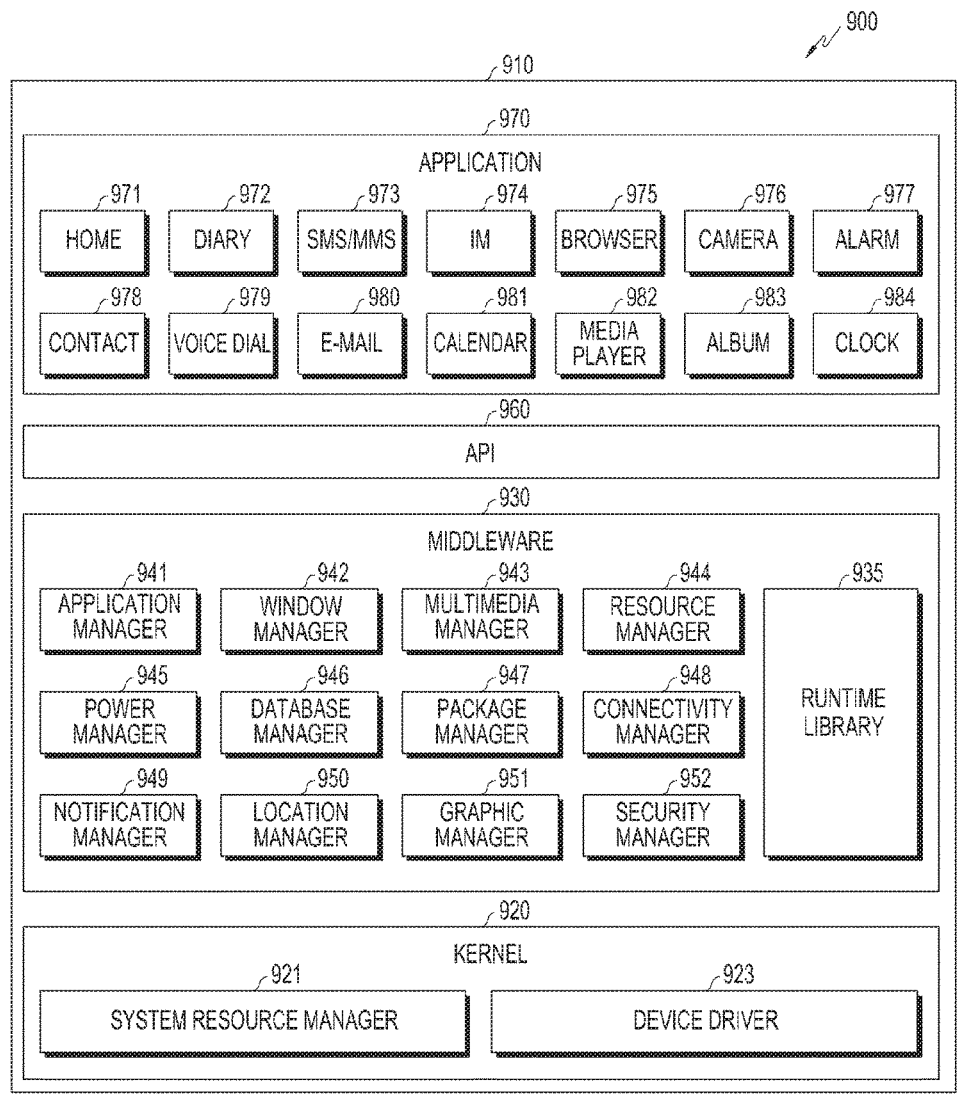
FIG. 9 is a block diagram of a program module according to an embodiment of the present invention.

FIG. 9 is a block diagram 900 of a program module 910 according to an embodiment of the present invention. According to an embodiment of the present invention, the program module 910 (e.g., the program 140) includes an Operating System (OS) which controls resources related to an electronic device (e.g., the electronic device 101) and/or various applications (e.g., the applications 147) which are driven on the OS. The OS may be, for example, Android, iOS, Windows®, Symbian, Tizen™, Bada, or the like.

The program module 910 includes a kernel 920, a middleware 930, an Application Programming Interface (API) 960 and/or an application 970. At least some of the program module 910 may be preloaded on the electronic device or may be downloaded from a server (e.g., the server 106).

The kernel 920 includes, for example, a system resource manager 921 or a device driver 923. The system resource manager 921 performs a control, an allocation or a collection of the system resources. According to an embodiment of the present invention, the system resource manager 921 includes a process management unit, a memory management unit, a file system management unit, or the like. The device driver 923 includes, for example, a display driver, a camera driver, a Bluetooth driver, a share memory driver, a USB driver, a keypad driver, a WiFi driver, an audio driver, or an Inter-Process Communication (IPC) driver.

The middleware 930 provides, for example, a function commonly required by the application 970, or may provide various functions to the application 970 such that the application 970 may effectively use limited system resources of the electronic device. According to an embodiment of the present invention, the middleware 930 (e.g., the middleware 143) includes at least one of a run time library 935, an application manager 941, a window manager 942, a multimedia manager 943, a resource manager 944, a power manager 945, a database manager 946, a package manager 947, a connectivity manager 948, a notification manager 949, a location manager 950, a graphic manager 951 and a security manager 952.

The run time library 935 includes, for example, a library module that a compiler uses in order to add new functions via a programming language while the application 970 is executed. The run time library 935 executes functions for input/output management, memory management or a calculation function.

The application manager 941 manages, for example, a life cycle of at least one application of the applications 970. The window manager 942 manages a GUI resource used in the screen. The multimedia manager 943 detects a format required for reproducing various media files and performs encoding or decoding of a media file by using a codec suitable for the corresponding format. The resource manager 944 manages resources such as source code, memory or storage space of at least one application among the applications 970.

The power manager 945 manages a battery or the power by operating together with a Basic Input/Output System (BIOS), and the like, and provides power information required for the operation of the electronic device. The database manager 946 generates, searches or changes a database to be used in at least one application among the applications 970. The package manager 947 manages the installation or the updating of applications distributed in the form of package file.

The connectivity manager 948 manages a wireless connection of, for example, Wi-Fi or Bluetooth. The notification manager 949 displays or notifies of an event such as a received message, an appointment, a proximity notification, and the like to a user without disturbance. The location manager 950 manages location information of the electronic device. The graphic manager 951 manages graphics effects to be provided to a user and user interfaces related to the graphics effects. The security manager 952 provides various security functions required for system security or user authentication. According to an embodiment of the present invention, when the electronic device (e.g., the electronic device 101) includes a telephone function, the middleware 930 further includes a telephony manager for managing a voice call or a video call of the electronic device.

The middleware 930 includes a middleware module which forms a combination of various functions of the above-mentioned elements. The middleware 930 provides modules specialized according to types of operating systems in order to provide a differentiated function. In addition, a few exiting component elements may be dynamically removed from the middleware 930, or new component elements may be added to the middleware 930.

The API 960 (e.g., the API 145) may be, for example, a set of API programming functions, and may differ according to operating system. For example, in the case of Android or iOS, one API set may be provided according to each platform, and in the case of the Tizen, two or more API sets may be provided according to each platform.

The application 970 includes at least one application capable of providing functions such as a home application 971, a diary application 972, an SMS/MMS application 973, an Instant Message (IM) application 974, a browser 975, a camera 976, an alarm 977, a contact application 978, a voice dial application 979, an email application 980, a calendar application 981, a media player 982, an album application 983, a clock 984, a health care application (e.g., a measuring of an exercise amount, a blood sugar or the like), an environment information application (e.g., providing information on atmospheric pressure, humidity, temperature, or the like).

According to an embodiment of the present invention, the application 970 includes an application (hereinafter, referred to as an "information exchange application") which can support an information exchange between the electronic device (e.g., the electronic device 101) and an external electronic device (e.g., the electronic devices 102 and 104). The information exchange application includes, for example, a notification relay application for transferring information to the external electronic device or a device management application for managing the external electronic device.

For example, the notification relay application includes a function of transferring notification information generated in another application (e.g., an SMS/MMS application, an email application, a health care application, an environment information application, or the like) of the electronic device to the external electronic device (e.g., the electronic devices 102 and 104). In addition, the notification relay application receives the notification information from, for example, the external electronic device, and provides the notification information to a user. For example, the device management application manages (e.g., installs, deletes or updates) at least one function (e.g., turning on/turning off or controlling brightness (or resolution) of a display of the external electronic device (or some parts of the external electronic device)) of the external electronic device communicating with the electronic device, an application operated in the external electronic device or a service (e.g., a call service or a message service) provided from the external electronic device.

According to an embodiment of the present invention, the application 970 includes an application (e.g., a health care application) designated according to properties (e.g., a type of an electronic device is a mobile medical equipment as properties of the electronic device) of the external electronic device (e.g., the electronic devices 102 and 104). According to an embodiment of the present invention, the application 970 includes an application received from the external electronic device (e.g., the server 106 or the electronic devices 102 and 104). According to an embodiment of the present invention, the application 970 includes a preloaded application or a third party application which may be downloaded from a server. Names of the elements of the program module 910 according to an embodiment of the present invention may be different according to type of operating system.

According to an embodiment of the present invention, at least a part of the programming modules 910 may be configured with software, firmware, hardware, or a combination of at least two of them. At least a part of the programming modules 910 may be implemented (for example, performed) by, for example, the application processor 810. At least some of the programming module 910 may include, for example, a module, a program, a routine, sets of instructions, or a process for performing one or more functions.

The term "module" or "functional unit" used in the present invention refers to, for example, a unit including one or more combinations of hardware, software, and firmware. The "module" is interchangeably used with, for example, the term "unit," "logic," "logical block," "component," or "circuit." The "module" or "function unit" may be a minimum unit of an integrated component element or a part thereof. The "module" may be a minimum unit for performing one or more functions or a part thereof. The "module" or "function unit" may be mechanically or electronically implemented. For example, the "module" according to the present invention may include at least one of an Application-Specific Integrated Circuit (ASIC) chip, a Field-Programmable Gate Arrays (FPGA), and a programmable-logic device for performing operations which are known or will be developed hereinafter.

According to an embodiment of the present invention, at least some of the devices (for example, modules or functions thereof) or the method (for example, operations) according to the present invention may be implemented by a command stored in a non-transitory computer-readable storage medium in a programming module form. When the command is executed by one or more processors (for example, the processor 120), the one or more processors execute a function corresponding to the command. The non-transitory computer-readable storage medium may be, for example, the memory 130.

The non-transitory computer readable storage medium may include magnetic media, such as a hard disk, a floppy disk and a magnetic tape, optical media, such as a Compact Disc Read Only Memory (CD-ROM) and a Digital Versatile Disc (DVD), magneto-optical media, such as a floptical disk, and a hardware device configured to store and execute a program instruction (for example, a programming module), such as a Read Only Memory (ROM), a Random Access Memory (RAM), a flash memory, and the like. In addition, the program instructions may include high class language codes, which can be executed in a computer by using an interpreter, as well as machine codes made by a compiler. Any of the hardware devices described above may be configured to work as one or more software modules in order to perform the operations according to various embodiments of the present invention, and vice versa.

Any of the modules or programming modules according to various embodiments of the present invention may include at least one of the above described elements, exclude some of the elements, or further include other additional elements. The operations performed by the modules, programming module, or other elements according to an embodiment of the present invention may be executed in a sequential, parallel, repetitive, or heuristic manner. Further, some operations may be executed according to another order or may be omitted, or other operations may be added.

According to an embodiment of the present invention, in a recording medium storing instructions set to perform at least one operation by at least one processor when the instructions are executed by at least one processor, at least one operation may include checking a value measured from a first identification (ID) pin which is included in a first function connecting unit of an external device connecting unit and is for detecting a connection with an external electronic device, checking a value measured from a second ID pin which is included in a second function connecting unit of the external device connecting unit and is for detecting the connection with the external electronic device, and determining the abnormality occurs in the external device connecting unit when the values measured from the first ID pin and the second ID pin satisfy a predetermined condition.

Various embodiments of the present invention disclosed in this specification and the drawings are merely examples presented in order to easily describe technical details of the present invention and to help the understanding of the present invention, and are not intended to limit the scope of the present invention. Therefore, it should be construed that, in addition to the embodiments of the present invention disclosed herein, all modifications and changes or modified and changed forms derived from the technical idea of an embodiment of the present invention fall within the scope of the present invention, as defined by the appended claims and their equivalents.

What is claimed is:

1. An electronic device, comprising:
an external device connecting unit comprising a first function connecting unit and a second function connecting unit, wherein the first function connecting unit includes a first identification (first ID) pin configured to detect a connection with an external electronic device, and wherein the second function connecting unit includes a second identification (second ID) pin configured to detect the connection with the external electronic device; and
a processor configured to determine that an abnormality or a normality occurs in the external device connecting unit when values measured from the first ID pin and the second ID pin satisfy a predetermined condition,
wherein the external device connecting unit is a connecting unit according to a micro Universal Serial Bus (USB) protocol.

2. The electronic device of claim 1, wherein the first function connecting unit is a connecting unit according to a USB protocol, and the second function connecting unit is a connecting unit according to a Mobile High-definition Link (MHL) protocol.

3. The electronic device of claim 1, wherein the value measured from the first ID pin is a voltage or a resistance, and wherein the value measured from the second ID pin is a voltage or a resistance.

4. The electronic device of claim 1, wherein the processor is further configured to determine that the abnormality occurs in the external device connecting unit when changes of the values measured from the first ID pin and the second ID pin satisfy the predetermined condition.

5. The electronic device of claim 1, wherein the processor is further configured to turn off power of the electronic device in accordance with determining the abnormality occurs.

6. The electronic device of claim 1, wherein the processor is further configured to display the abnormality or a normality on a screen in accordance with determining the abnormality occurs or not.

7. The electronic device of claim 1, wherein the processor is further configured to repeatedly perform determining of the abnormality or a normality in a predetermined period when the processor determines that the abnormality occurs in the external device connecting unit.

8. The electronic device of claim 1, further comprising:
a first function control unit connected to at least one pin in the first function connecting unit, and is configured to convert an analog identification (analog ID) value measured from the first ID pin of the first function connecting unit into a digital identification (digital ID) value, and provide the digital ID value to the processor.

9. The electronic device of claim 1, further comprising:
a second function control unit connected to at least one pin in the second function connecting unit, and configured to provide an analog ID value measured from the second ID pin of the second function connecting unit to an Analog-to-Digital Converter (ADC) port of the processor.

10. A method of determining an abnormality or a normality of a connecting unit in an electronic device, the method comprising:
checking a value measured from a first identification (first ID) pin which is included in a first function connecting unit of an external device connecting unit, which is for detecting a connection with an external electronic device;
checking a value measured from a second identification (second ID) pin which is included in a second function connecting unit of the external device connecting unit, which is for detecting the connection with the external electronic device; and
determining the abnormality occurs in the external device connecting unit when the values measured from the first ID pin and the second ID pin satisfy a predetermined condition,
wherein the external device connecting unit is a connecting unit according to a micro Universal Serial Bus (USB) protocol.

11. The method of claim 10, wherein the first function connecting unit is a connecting unit according to a USB protocol, and the second function connecting unit is a connecting unit according to a Mobile High-definition Link (MHL) protocol.

12. The method of claim 10, wherein the value measured from the first ID pin is a voltage or a resistance, and the value measured from the second ID pin is a voltage or a resistance.

13. The method of claim 10, wherein determining the abnormality occurs comprises determining that the abnormality occurs in the external device connecting unit when changes of the values measured from the first ID pin and the second ID pin satisfy the predetermined condition.

14. The method of claim 10, further comprising:
turning off power to the electronic device in accordance with determining the abnormality occurs.

15. The method of claim 10, further comprising:
displaying the abnormality or the normality on a screen in accordance with determining the abnormality occurs.

16. The method of claim 10, further comprising:
repeatedly performing determining of the abnormality or the normality in a predetermined period when it is determined that the abnormality occurs in the external device connecting unit.

17. The method of claim 10, further comprising:
receiving an analog identification (analog ID) value, measured from the first ID pin of the first function connecting unit, from a first function control unit connected to at least one pin in the first function connecting unit; and
converting the received analog ID value into a digital identification (digital ID) value and providing the digital ID value to a processor.

18. The method of claim 10, further comprising:
providing an analog identification (analog ID) value, which is measured from the second ID pin of the second function connecting unit, from a second function control unit connected to at least one pin in the second function connecting unit to an Analog-to-Digital Converter (ADC) port of a processor.

* * * * *